(12) United States Patent
Creeden

(10) Patent No.: US 6,285,205 B1
(45) Date of Patent: Sep. 4, 2001

(54) APPARATUS FOR ELECTRONICALLY TESTING PRINTED CIRCUIT BOARDS OR THE LIKE

(75) Inventor: Joseph M. Creeden, Alto Loma, CA (US)

(73) Assignee: Test Connections, Inc., Upland, CA (US)

( * ) Notice: Subject to any disclaimer, the term of this patent is extended or adjusted under 35 U.S.C. 154(b) by 0 days.

(21) Appl. No.: 08/342,656

(22) Filed: Nov. 21, 1994

Related U.S. Application Data

(63) Continuation of application No. 07/683,872, filed on Apr. 11, 1991, now abandoned.

(51) Int. Cl.[7] ................................................. G01R 1/073
(52) U.S. Cl. ............................................. 324/761; 324/758
(58) Field of Search ..................................... 324/761, 754, 324/765, 757, 758

(56) References Cited

U.S. PATENT DOCUMENTS

| | | | |
|---|---|---|---|
| 4,322,682 | * 3/1982 | Schadwill | 324/761 |
| 4,352,061 | * 9/1982 | Matrone | 324/158 P |
| 4,528,500 | 7/1985 | Lightbody et al. | 324/73 |
| 4,614,386 | 9/1986 | Driller et al. | 339/17 |
| 4,622,514 | * 11/1986 | Lewis | 324/158 P |
| 4,650,233 | 3/1987 | Mang et al. | 294/64.1 |
| 4,674,006 | 6/1987 | Driller et al. | 361/393 |
| 4,721,908 | 1/1988 | Driller et al. | 324/158 |
| 4,745,296 | 5/1988 | Driller et al. | 250/563 |
| 4,803,424 | * 2/1989 | Ierardi et al. | 324/158 P |
| 4,834,659 | 5/1989 | Mang et al. | 324/754 |
| 4,843,315 | * 6/1989 | Bayer et al. | 324/158 P |
| 4,851,765 | 7/1989 | Driller et al. | 324/158 |
| 4,952,871 | 8/1990 | Driller et al. | 324/158 |
| 4,952,872 | 8/1990 | Driller et al. | 324/158 |

FOREIGN PATENT DOCUMENTS 0 299 232 A1    1/1988   (EP) .

* cited by examiner

*Primary Examiner*—Ernest Karlsen
(74) *Attorney, Agent, or Firm*—Denton L. Anderson; Sheldon & Mak

(57) ABSTRACT

Apparatus for electronically testing printed circuit boards including a plurality of generally parallel test pins which have a section of reduced diameter along their length intermediate the ends thereof, and a plate having a plurality of drilled holes in which the test pins are mounted with the reduced diameter portions being located in the holes, the plate being adapted to interfere with shoulders at the ends of the sections of reduced diameter to retain the test pins in the testing apparatus.

16 Claims, 3 Drawing Sheets

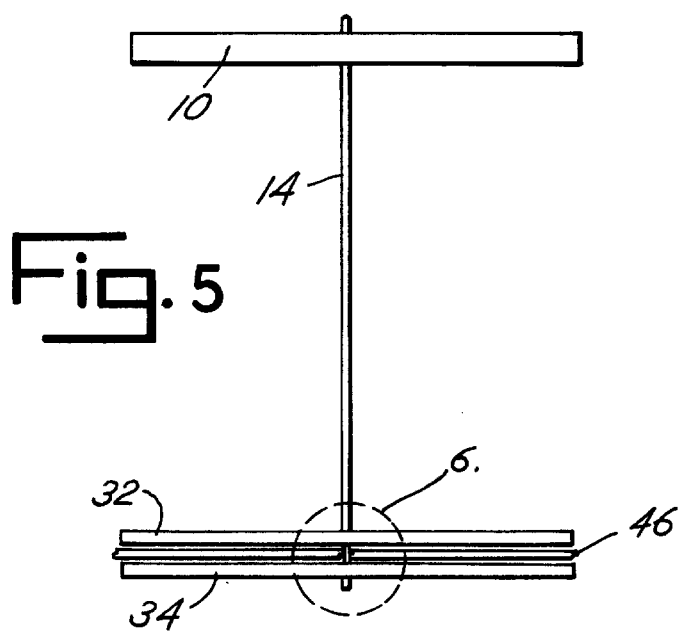
Fig. 5
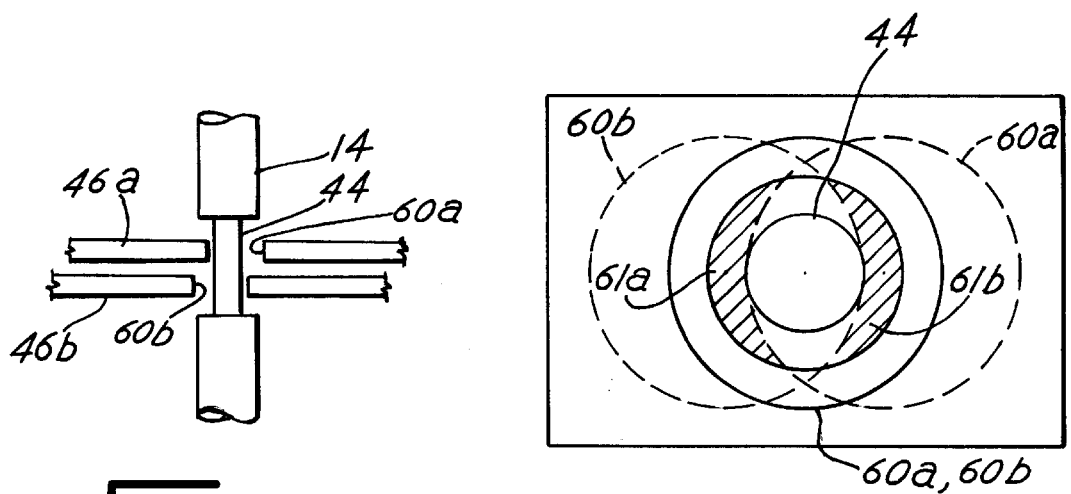
Fig. 6
Fig. 7
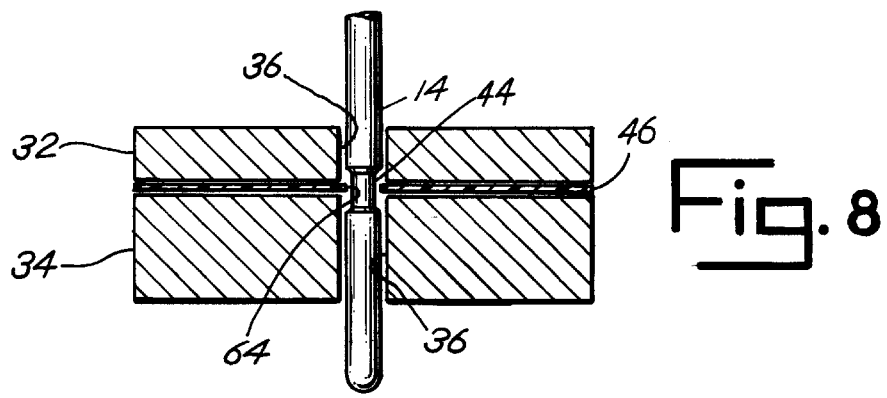
Fig. 8

APPARATUS FOR ELECTRONICALLY TESTING PRINTED CIRCUIT BOARDS OR THE LIKE

This is a continuation of application Ser. No. 07/683,872, filed Apr. 11, 1991, now abandoned.

BACKGROUND OF THE INVENTION

1. Field of the Invention

The present invention relates to apparatus for electronically testing printed circuit boards or the like. Such apparatus includes a plurality of substantially parallel test pins or test probes for making electrical contact between respective contact areas on a printed circuit board or the like to be tested and a plurality of corresponding resilient contact elements disposed in accordance with a grid of an array plate or the like against which the apparatus is urged, and a mask plate extending at right angles to the test pins and having therein through-bores through which extend the test pins. First ends or tips of the test pins project through the through-bores in the mask plate to engage the contact areas of the printed circuit board. Such apparatus may include a very large number of such generally parallel test pins or test probes, e.g., 20,000 or more.

Apparatus of the above type is rather fully described in Driller et al., U.S. Pat. No. 4,721,908 and Mang et al., U.S. Pat. No. 4,834,659. The principal object of the present invention is to afford improvements over the devices disclosed in the foregoing patents, particularly relative to the design of the test probes, and the manner of retaining such test probes in the apparatus, while readily permitting their removal if desired.

In the apparatus disclosed in Driller et al., U.S. Pat. No. 4,721,908, an elastic plate in the nature of a rubber sheet is provided for mounting the plurality of test probes. In such an arrangement, the test probes are in the nature of straight pins without any enlarged or reduced sections. The elastic plate is in the nature of a rubber sheet through which the plurality of test pins are pressed so as to perforate the sheet and thereby mount the test pin. In the foregoing known device, the elastic plate or sheet firmly engages the periphery of each of the test pins extending therethrough, and in that manner prevents them from dropping from the testing apparatus.

One disadvantage of the foregoing device is that movement of one test pin can influence movement of several other adjacent test pins due to the manner in which they are mounted in the elastic or rubber sheet in close spacing to one another. Thus, in use of such a device, if one test pin is urged in a longitudinal direction, several other pins could be caused to move with it, which is a disadvantage. It must be borne in mind that such an apparatus may include several thousand such test pins or test probes, and it is preferable that each pin be capable of longitudinal movement independently of the others.

In the apparatus of Mang et al., U.S. Pat. No. 4,834,659, there is disclosed a different means of supporting the test pins which represents an attempt to solve the problem discussed above where longitudinal movement of a single test pin can cause similar movement of adjacent pins. In the Mang et al. patent, straight test pins are not used. Instead, each test pin is provided with an enlarged section of relatively short length. One form of enlargement comprises a section which is hammered or deformed. As a result, the normally round test pin will have a flattened area which is enlarged.

In the Mang et al. patent, various types of enlarged pin sections are disclosed, but in each case the concept is the same. The pins are mounted in a pair of inner and outer adapter plates formed with a large number of holes or bores which normally would conform to the connection points to be tested on a printed circuit board or the like. Such bores are larger in diameter than the outer diameter of the test pins, but smaller in diameter than the enlarged section of each test pin. The pins are assembled so that the enlarged pin sections are disposed between the inner and outer adapter plates, thereby trapping the pins relative to the two adapter plates and preventing them from falling out of the test apparatus.

The main object of the present invention is to provide an improved type of test pin which is neither straight nor has an enlarged section, but rather has a section which is reduced in size compared to the normal pin diameter.

A related object of the invention is to provide improved apparatus for retaining test pins or test probes in a testing device which effectively retains the pins in the desired positions, permits independent longitudinal movement of one pin relative to adjacent pins, and yet readily permits removal of pins from the apparatus when desired, such advantages being achieved without providing any enlarged sections along the length of a test pin.

An important advantage of the present invention in comparison with test pins having enlarged sections is that it permits the pins to be arrayed in closer proximity to one another. It is highly desirable to be able to provide for greater miniaturization or closer spacing of the test pins, because the industry is continuing to seek higher density in printed circuit boards and associated components, with the result that apparatus for electronically testing such printed circuit boards requires closer spacing of the thousands of test pins or test probes.

The foregoing and other objects and advantages of the invention will be apparent from the following description of certain preferred embodiments thereof, taken in conjunction with the accompanying drawings.

DESCRIPTION OF THE DRAWINGS

FIG. 5 is an elevational view, somewhat schematic in form, illustrating the manner in which a test pin is retained and thereby prevented from falling from the test apparatus;

FIG. 6 is an enlargement of a portion of FIG. 5 showing the manner in which two horizontally movable plates or sheets cooperate with a reduced section of a test pin to effect retention of the pin in accordance with one embodiment of the invention;

FIG. 7 is an enlarged, schematic view demonstrating the manner in which the two slidable sheets of FIG. 6 effect retention of a test pin, the retention areas provided by the two sheets being shown as shaded; and FIG. 8 is an elevational view illustrating an alternative embodiment of the present invention utilizing a single retention sheet which need not be moved horizontally to effect retention.

Now, in order to acquaint those skilled in t he art with the manner of making and using the invention, I shall describe, in conjunction with the accompanying drawings, certain prefer red embodiments of the invention.

DETAILED DESCRIPTION OF THE INVENTION

Figure 1:
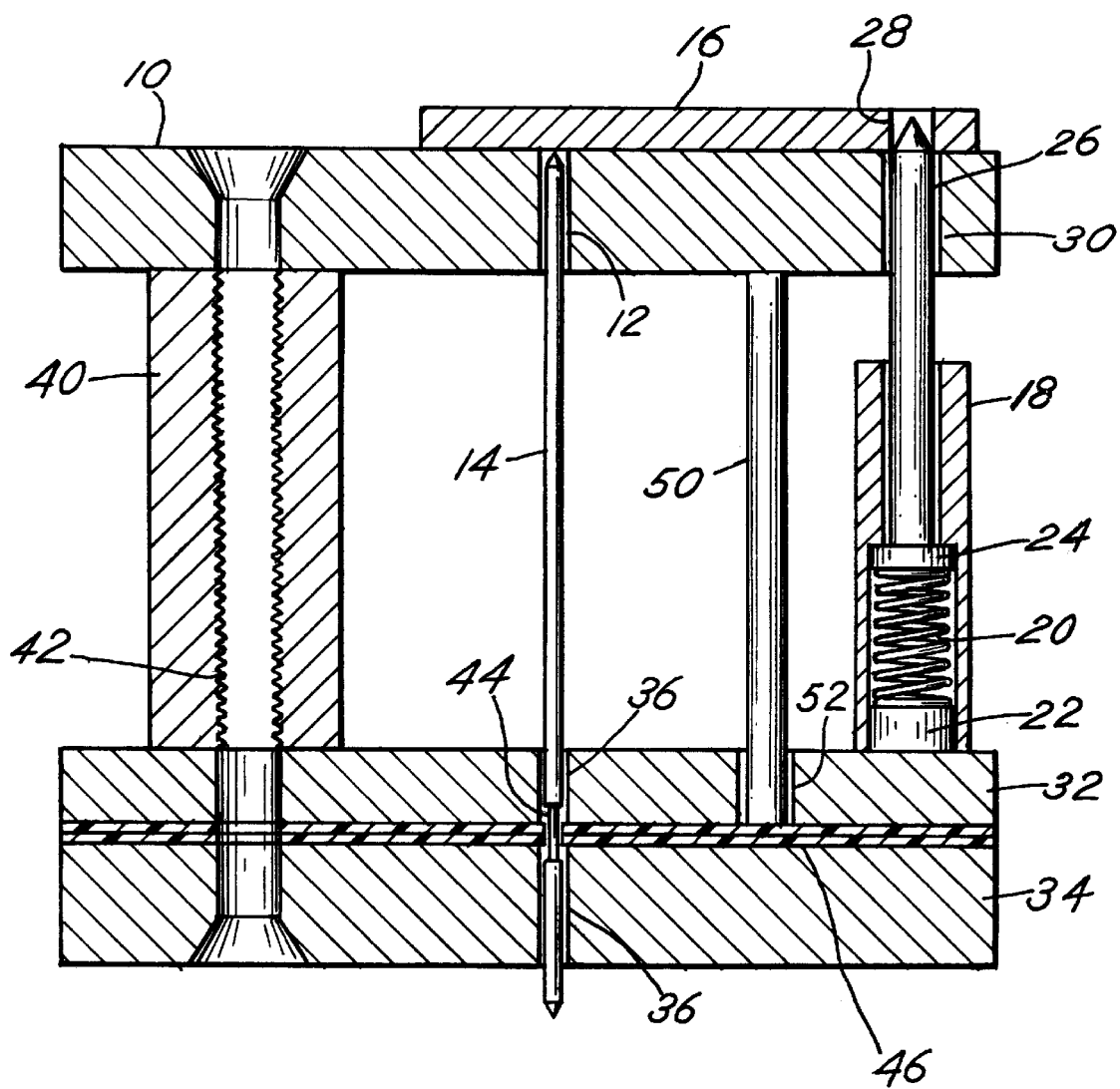
FIG. 1 is an elevational view, partly in section, illustrating test apparatus embodying the present invention, the showing being somewhat schematic in the sense that only a single one of possibly thousands of test pins or test probes is shown for better understanding of the invention.

Referring now to the drawings, FIG. 1 shows test apparatus for electronically testing printed circuit boards and the like, including a plate 10 having drilled holes 12 which receive therethrough test pins or probes 14, and which are specially spaced according to the connection points on a printed circuit board 16 or the like to be tested. The printed circuit board 16 is mounted immediately above the plate 10 so that upper ends of test probes 14 can pass through the drilled holes 12 in plate 10 and contact the connection points to be tested on the circuit board 16. Th e test probe or test pin 14 is longitudinally rigid and made of spring steel or "music wire" as is known in the art.

As described previously, there are normally a large number of test probes or test pins 14 in a given test apparatus, as many as 20,000 or more such test probes. Because the drilled holes 12 in the plate 10 are specially arranged to correspond to the connection points on the circuit board 16 to be tested, it is necessary that circuit board 16 be mounted in precise relationship to the testing device, and in particular, to the plate 10.

For that purpose, there is provided apparatus comprising a housing 18, compression spring 20, plug 22 and disc member 24 which cooperate with conical pin 26. In the foregoing manner, conical pin 26 is spring-loaded upwardly so the pin passes through a hole 30 in the plate 10 and the conical upper end of the pin centers in a tooling hole 28 in the circuit board 16, for the purpose of effecting proper registration between the circuit board 16 and the upper ends of the test probes 14.

At the lower end of the test apparatus, as illustrated in FIG. 1, there are provided a pair of horizontal plates 32 and 34 which have a plurality of drilled holes 36 which receive the test probes 14 therethrough. As more fully described in the above-mentioned Driller et al. and Mang et al. patents, the lower ends of such test probes engage corresponding ones of an array of contact elements of the testing apparatus. Of course, a plurality of the board registration pins 26 may be provided to effect proper registration of the circuit board 16 to be tested.

The drilled holes 36 in the plates 32 and 34 are arranged corresponding to a specified grid of an electrical test system. The spacing of such holes will not necessarily correspond to the spacing of the holes 12 in the plate 10 which are specially spaced to correspond to the connection points on the circuit board 16 to be tested. As a result, the test pins 14 may have to shift laterally as they pass upwardly from the holes 36 in plates 32 and 34 to the holes 12 in the plate 10. While the test pins 14 are described as longitudinally rigid, they are capable of such lateral bending.

A spacer is shown at 40 having a hole 42 which is drilled through the spacer 40 and tapped. Such spacers do not permit movement between the upper plate 10 and the lower plates 32 and 34, as distinguished for example from the apparatus disclosed in Mang et al., U.S. Pat. No. 4,834,659 which discloses resilient spacer members which do permit such relative movement.

Still referring to FIG. 1, the test probe 14 is provided with a reduced diameter section 44 which extends through a sheet of material identified at 46 which, as more fully described hereinafter, may comprise one or more sheets of material. In accordance with one embodiment, the sheet 46 preferably comprises two sheets, one on top of the other, which are independently slidable horizontally for a purpose to be described. In accordance with an alternative embodiment, the sheet 46 may comprise a single sheet which is not horizontally movable. In either case, the sheet or sheets 46 are preferably made of material such as polyester film or mylar.

Figure 2:
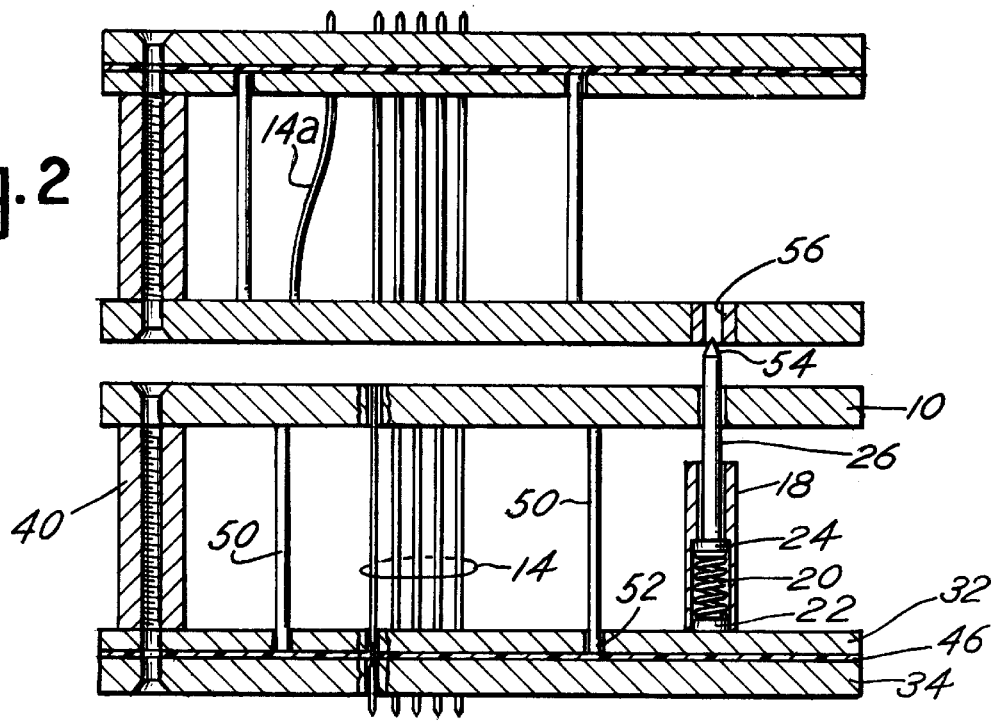
FIG. 2 is a view similar to FIG. 1, except it shows apparatus designed to simultaneously test opposite sides of a printed circuit board or the like, whereas the apparatus of FIG. 1 is intended to test only one such side.

FIG. 1 shows a further rigid support spacer 50, the purpose of which is to balance compression when two sides of a circuit board 16 are tested simultaneously as illustrated in FIG. 2. The spacer 50 passes through a hole 52 formed in the plate 32. The spacer 50 fits closely within the hole 52, thereby maintaining the spacer 50 in a perpendicular or upright position with the upper end of the spacer 50 positioned beneath the plate 10.

FIG. 2 shows testing apparatus which is essentially the same as shown in FIG. 1, except it includes two sets of the apparatus of FIG. 1, one disposed on each side of a printed circuit board (not shown) to be tested. Thus, corresponding parts are identified with the same numerals as in FIG. 1. In FIG. 2, one of the numerous test probes is identified at 14a and is shown bent laterally to accommodate the difference in spacing which may occur between the holes in the plate 10, the latter holes being arranged to correspond to the connection points on a circuit board to be tested.

It will be seen in FIG. 2 that the alignment pin 26 has a conical top 54 which cooperates with a bushing 56 to effect proper alignment between the upper and lower test fixtures, there being several such pins 26 as desired. It will be noted from FIG. 2 that the test apparatus disposed to test the top side of a circuit board (not shown) is inverted relative to the apparatus for testing the underside of such a circuit board. As a result, it is important that the test probes 14 be retained in both longitudinal directions, although limited longitudinal movement of a test probe independently of other test probes is an advantage afforded by the present invention.

Figure 3:
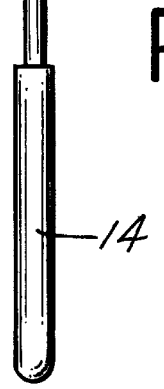
FIG. 3 is a detail view of a test pin or test probe having a recessed section in accordance with the present invention.
Figure 4:
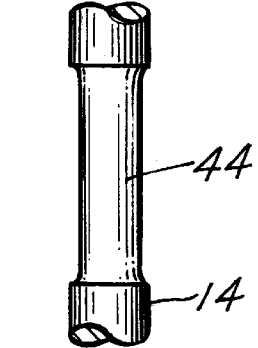
FIG. 4 is a fragmentary, detail view of a recessed section of a test pin in accordance with the present invention.

FIG. 3 is a detail view of a steel test probe or test pin 14 having a reduced diameter section 44 of a predetermined length. It is an important feature of the present invention that the test probes have such a reduced diameter section. Such a section may be formed in various ways, although the preferred procedure is to machine a groove 44 for the purpose of creating retention shoulders at each end of the reduced diameter section 44. The test probe shown in FIG. 3 is of a type having rounded ends. However, it is known in the art to utilize a wide variety of different types of test probes, and the machined groove 44 of the present invention may be utilized with any of those different types. FIG. 4 is a fragmentary view illustrating one example of a particular form of machined groove 44.

Reference is now made to FIGS. 5–7 which illustrate the manner of retention of the test probes 14 in accordance with one embodiment of the present invention. FIG. 5 is a somewhat schematic view which illustrates one of several thousand test pins 14. As in the illustration of FIG. 1, the upper end of test pin 14 passes through an opening in a plate 10 to make contact with a connection point on a circuit board (not shown) to be tested. The lower end of pin 14 passes through the plates 32 and 34, which are also shown in FIG. 1 which illustrates the holes 36 in those plates through which the pins 14 pass. The holes 36 in the two plates 32 and 34 are larger in diameter than the outer diameter of the test pin 14. As a result, a test pin 14 can readily pass through the plates 32 and 34 and is not longitudinally retained thereby, so additional means is required to prevent the test pins 14 from falling out of the test apparatus.

As previously described, the sheet shown at 46 in FIG. 5 may take different forms. In one embodiment as shown in FIG. 6, the sheet 46 comprises two separate sheets of mylar material which are positioned one above the other and are horizontally slidable relative to one another. The two mylar sheets are indicated at 46a and 46b, and they have holes 60a and 60b formed therein. The holes 60a and 60b are larger in diameter than the diameter of the test pin 14, with the result that the pin 14 may be readily passed through the mylar sheets 60a and 60b if those sheets are positioned with the holes 60a and 60b aligned with the corresponding test pin 14. However, FIG. 6 illustrates a non-aligned condition where the upper mylar sheet 46a has been moved to the right, while the lower mylar sheets 46b has been moved to the left.

In the latter condition, the sheets 46a and 46b will interfere with the annular shoulders at the opposite ends of the reduced diameter section 44 thereby retaining the pin 14 and preventing it from falling from the test apparatus. Accordingly, with apparatus as shown in FIG. 6, each of the sheets 46a and 46b may be slid or horizontally moved to positions which create interference with the test pin 14 and retain it, subject to limited longitudinal movement depending upon the thickness of the sheets 46 and the length of the reduced diameter section 44. The sheets 46a and 46b may also be moved to positions where the holes 60a and 60b are aligned with the test pin 14 so that the pin may readily be inserted in or removed from the test apparatus.

FIG. 7 is an enlarged diagrammatic view which aids in understanding the foregoing. It can be seen that the holes 60a and 60b in plates 46 are larger in diameter than the outer diameter of the test probe 14. As a result, when the two holes 60a and 60b are aligned with probe 14, the probe may readily be inserted or removed. However, if the plate 46a is moved to the right as in FIG. 6, it interferes with the annular shoulder at the upper end of the reduced diameter portion 44, and that area of interference is represented by the shaded portion 61a in FIG. 7. Similarly, if the plate 46b is moved to its left-hand position as shown in FIG. 6, it interferes with the annular shoulder at the lower end of the reduced diameter portion 44, and that area of interference is represented by the shaded portion 61b in FIG. 7. It is within the scope of the present invention to utilize only one of the two slidable plates 46. However, it is preferred to use two slidable plates because that provides a greater area of interference or retention and thus more securely retains the test probe 14.

FIG. 8 shows an important alternative embodiment of the invention utilizing a single sheet 46 which need not be shifted horizontally. In the embodiment of FIG. 8, as previously described, the holes 36 in the plates 32 and 34 are larger in diameter than the test pin 14 so they do not provide longitudinal retention. However, the hole shown at 64 in the single plate 46 is larger than the diameter of the grooved portion 44, but smaller than the outer diameter of the probe or pin 14.

As a result, when the test probe 14 is in the position shown in FIG. 8, it will be retained due to interference between the plate 46 and the annular shoulders at both ends of the reduced diameter portion 44 of probe 14. It will be understood that in order to place the probe 14 in the retained position as illustrated, a portion of the larger diameter of probe 14 must be forced through the smaller opening 64 in sheet 46, which is possible because the sheet 46 is made of mylar or other compliant material which is capable of the required deformation.

Relative to the test pin or probe 14 of the present invention, while a reduced diameter section in accordance with the present invention may take various forms, it is preferred to machine a groove to create the reduced diameter section, as shown for example at 44 in FIG. 4.

The plate or plates 46 which cooperate with the groove may be made of various materials. A preferred form is a sheet of polyester film or mylar or the like having a thickness of 0.007 inch.

In the embodiment described herein, three plates 10, 32 and 34 are illustrated in addition to the sheet or sheets 46. Such plates are commonly made of polycarbonate or acrylic materials. The upper plate shown at 10 in FIG. 1 positions the test probes or pins 14 to the circuit board or other product to be tested, and thus the holes 12 in that plate correspond to connection points or the like on a circuit board or product to be tested.

The lower two plates shown at 32 and 34 may not be required in all applications. However, they serve to support the sheet or sheets shown at 46, and they also serve to position the probes 14. The holes 36 drilled in the plates 32 and 34 are arranged according to a desired grid system of a given test device, and the drilled holes 60a and 60b in the mylar sheets 46a and 46b of the FIG. 6 embodiment, or the holes 64 in the FIG. 8 embodiment, correspond to that same grid pattern.

As previously described, in the embodiment of FIGS. 1–7, the sheet or sheets 46 are movable laterally so one can position them with their holes in or out of register with the test probes. With such an arrangement, it is a simple matter to load or unload the test pins 14, and they are effectively retained when the sheet or sheets 46 are moved to the retained or testing position to create interference areas as shown at 61a and 61b in FIG. 7.

In the embodiment of FIG. 8, the single sheet 46 is not slidable because pins are loaded or unloaded by forcing the outer diameter of the pin 14 through the somewhat smaller hole 64 in the sheet 46. However, after the pin 14 is positioned as shown in FIG. 8, the pin is free-floating longitudinally a limited distance. Similarly, in the embodiment of FIGS. 1–7, the pins, as shown in example in FIG. 1, are capable of limited longitudinal movement, depending upon the length of the grooved section 44 and the thickness of the plates 46.

The two plates 32 and 34 comprise rigid base platens which overlie a contact element array (not shown) in the testing apparatus in a planar relationship. The holes 36 in those two base platens are larger than the outer diameter of the test pins 14 to allow for unrestricted movement of the pins in a vertical or longitudinal direction. The various rigid spacer elements as shown at 40 and 42 maintain a fixed relationship between the two base platens 32 and 34 and the upper fixture or mask plate 10. As previously described, the holes 12 in the upper plate 10 correspond to specific contact points on a circuit board 16 to be tested. Again, the drilled holes 12 are larger than the outer diameter of the test pins 14 to allow for unrestricted vertical movement of such pins.

The sheet or sheets 46 are preferably compliant or non-rigid compared to the plates 32 and 34, and the drilled passages 60a and 60b of FIG. 6, or the drilled passages 64 in the FIG. 8 embodiment, are arranged in the same grid pattern of the holes 36, but not necessarily of the same diameter. In the embodiment of FIGS. 1–7, the drilled holes 60a and 60b (see FIG. 7) are preferably larger than the diameter of the drilled holes 36 in platens 32 and 34, as well as being larger than the outer diameter of the test pins 14. In the embodiment of FIG. 8, the drilled holes 64 are smaller than the outer diameter of the test pins 14, but larger than the reduced diameter of the portion 44 of those pins.

It should be understood that in the embodiment of FIGS. 1–7, when the compliant plates or platens 46a and 46b are moved in opposite directions to the retention or testing position as shown in FIGS. 6 and 7, the pins 14 are securely locked in place allowing only for vertical movement restricted to the length of the reduced diameter portion 44. A similar result is achieved by the embodiment of FIG. 8 in that the test pin or probe 14 is positioned in place, allowing primarily only for vertical movement restricted to the length of the section 44.

What is claimed is:

1. In a testing apparatus for electronically testing printed circuit boards or other products, the improvement comprising, in combination, a plurality of integrally formed, generally parallel test pins for making electrical contact between areas on a product to be tested and corresponding contact elements of an electrical test system, each of said test pins having a first tapered end and a second tapered end defining a length of each of the test pins and further having a continuously uniform diameter along an entire length defined between the first tapered end and the second tapered end except for a section of reduced cross-section along a portion of the entire length of each of the test pins intermediate the first tapered end and the second tapered end thereof to define shoulder means at an end of said section of reduced cross-section wherein the uniform diameter is the maximum diameter of the pin along the length and further wherein the first tapered end of the test pin contacts the product to be tested and the second tapered end of the test pin contacts a contact element of the electrical test system, and plate means having holes formed therein larger than said sections of reduced cross-section of said test pins, said test pins mounted with said sections of reduced cross-section in said holes, whereby said plate means is adapted to cooperate with said shoulder means to retain said test pins in said testing apparatus.

2. The improvement of claim 1 where the length of said section of reduced cross-section exceeds the thickness of said plate means to permit limited free longitudinal movement of said test pins.

3. The improvement of claim 2 where said pins are made of round wire and said section of reduced cross-section is formed by machining a groove in said pins to reduce the diameter thereof along a predetermined length of said pins.

4. The improvement of claim 2 where said holes in said plate means are of a diameter less than the diameter of said test pins but larger than the diameter of said section of reduced cross-section of said test pins, whereby said pins must be forced through said holes temporarily enlarging the same until said sections of reduced cross-section of said test pins are positioned in said holes after which free longitudinal movement of said test pins is permitted an amount limited by the length of said section of reduced cross-section.

5. In a testing apparatus for electronically testing printed circuit boards or other products, the improvement comprising, in combination, a plurality of integrally formed, generally parallel test pins for making electrical contact between areas on a product to be tested and corresponding contact elements of an electrical test system, each of said test pins having a first tapered end and a second tapered end defining a length of each of the test pins and further having a continuously uniform diameter along an entire length defined between the first tapered end and the second tapered end except for a section of reduced cross-section along a portion of the entire length of each of the test pins intermediate the first tapered end and the second tapered end thereof to define shoulder means at an end of said section of reduced cross-section wherein the uniform diameter is the maximum diameter of the pin along the length and further wherein the first tapered end of the test pin contacts the product to be tested and the second tapered end of the test pin contacts a contact element of the electrical test system, and compliant plate means having holes formed therein in which said plurality of test pins are mounted, said holes in said compliant plate means having a diameter less than the diameter of said test pins but larger than the diameter of said section of reduced cross-section, said test pins mounted with said section of reduced cross-section located in said holes, whereby said test pins must be forced through said holes, temporarily enlarging the same until said section of reduced cross-section of said test pins is positioned in said holes, said length of said sections of reduced cross-section being greater than the thickness of said plate means whereby free longitudinal movement of said test pins is permitted an amount limited by the length of said section of reduced cross-section.

6. The improvement of claim 5 where said shoulder means are formed at each end of the length of said section of reduced cross-section so that longitudinal movement of said pins is restricted by said plate means in both longitudinal directions.

7. The improvement of claim 6 where said test pins are made of round wire and said section of reduced cross-section is formed by machining a groove in said pins to reduce the diameter thereof along a predetermined length of said pins.

8. In a testing apparatus for electronically testing printed circuit boards or other products, the improvement comprising, in combination, a plurality of integrally formed, generally parallel test pins for making electrical contact between areas on a product to be tested and corresponding contact elements of an electrical test system, said test pins made of round wire and having a first tapered end and a second tapered end defining a length of each of the test pins and further having a continuously uniform diameter along an entire length defined between the first tapered end and the second tapered end except for a section of reduced diameter formed along a portion of the entire length of each of the test pins intermediate the first tapered end and the second tapered end thereof by machining a groove therein to thereby define shoulder means at the opposite ends of said groove wherein the uniform diameter is the maximum diameter of the pin along the length and further wherein the first tapered end of the test pin contacts the product to be tested and the second tapered end of the test pin contacts a contact element of the electrical test system, and compliant plate means having holes formed therein through which said plurality of test pins pass, said holes in said compliant plate means having a diameter less than the diameter of said test pins but larger that the diameter of said groove portion of said test pins, whereby said test pins must be forced through said holes temporarily enlarging the same until said grooved portion of reduced diameter of said test pins is positioned in said holes after which free longitudinal movement of said test pins is permitted an amount limited by the length of said grooved section which is greater than the thickness of said compliant plate means.

9. The improvement of claim 8 where said compliant plate means is made of a material taken from the group consisting of mylar and polyester film.

10. The improvement of claim 8 where said compliant plate means is positioned between upper and lower rigid platen means, each of said platen means having holes formed therein in a grid pattern corresponding to the holes in said compliant plate means.

11. The improvement of claim 1 where said holes in said plate means are larger than the outer diameter of said test pins, said plate means being movable in a direction perpendicular to said test pins to position said plate means in interfering relation with said shoulder means to retain said test pins in said testing apparatus.

12. In a testing apparatus for electronically testing printed circuit boards or other products, the improvement comprising, in combination:

a plurality of integrally formed, generally parallel test pins making electrical contact between areas on a product to be tested and corresponding contact elements of an electrical test system, each of said test pins having a first tapered end and a second tapered end defining a length of each of the test pins and further having a continuously uniform diameter along an entire length defined between the first tapered end and the second tapered end wherein the uniform diameter is the maximum diameter of the pin along the length and further wherein the first tapered end of the test pin contacts the product to be tested and the second tapered end of the test pin contacts a contact element of the electrical test system;

a reduced cross-section portion defined between shoulders defining a reduced cross-section length, a total length of said reduced cross-section portion being less than the entire length of said uniform diameter portion; and plate means having holes formed therein defining an area larger than said reduced cross-section portion of said test pins, said test pins mounted with said reduced cross-section portion in said holes whereby said plate means is adapted to cooperate with said shoulders to retain said test pins in said testing apparatus.

13. The improvement of claim 12 wherein said uniform diameter portion provides for a smooth, non-interlocking surface during side-by-side proximity of pins prior to loading wherein said loading speeds are enhanced due to the ability to automatically and mechanically load said pins from a container having said pins in close parallel proximity.

14. The improvement of claim 12 wherein said test pins may be repetitively inserted and extracted from said apparatus.

15. The improvement of claim 12 wherein insertion and extraction of said test pins from said apparatus may occur from both sides of said apparatus.

16. The improvement of claim 3 wherein each of said test pins is constructed from one piece having said groove machined therein.

* * * * *